(12) United States Patent
Chang

(10) Patent No.: US 10,186,452 B2
(45) Date of Patent: Jan. 22, 2019

(54) ASYMMETRIC STAIR STRUCTURE AND METHOD FOR FABRICATING THE SAME

(71) Applicant: MACRONIX International Co., Ltd., Hsinchu (TW)

(72) Inventor: Yao-Yuan Chang, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 0 days.

(21) Appl. No.: 15/471,771

(22) Filed: Mar. 28, 2017

(65) Prior Publication Data

US 2018/0286743 A1 Oct. 4, 2018

(51) Int. Cl.
| | | |
|---|---|---|
| *H01L 21/00* | (2006.01) | |
| *H01L 21/768* | (2006.01) | |
| *H01L 23/532* | (2006.01) | |
| *H01L 23/522* | (2006.01) | |
| *H01L 23/528* | (2006.01) | |

(52) U.S. Cl.
CPC .. *H01L 21/76816* (2013.01); *H01L 21/76877* (2013.01); *H01L 23/5226* (2013.01); *H01L 23/5283* (2013.01); *H01L 23/5329* (2013.01); *H01L 23/53209* (2013.01); *H01L 23/53257* (2013.01); *H01L 23/53271* (2013.01)

(58) Field of Classification Search
CPC ......... H01L 21/76816; H01L 21/76877; H01L 23/5283; H01L 23/5226; H01L 23/53209; H01L 23/53257; H01L 23/53271; H01L 23/5329

See application file for complete search history.

(56) References Cited

U.S. PATENT DOCUMENTS

| | | | | |
|---|---|---|---|---|
| 2012/0171861 A1* | 7/2012 | Park | ................... | H01L 21/31144 438/639 |
| 2014/0329379 A1* | 11/2014 | Kim | ................... | H01L 21/28008 438/586 |
| 2016/0148946 A1* | 5/2016 | Hironaga | .......... | H01L 27/11556 257/324 |

* cited by examiner

*Primary Examiner* — Charles Garber
*Assistant Examiner* — Abdulfattah Mustapha
(74) *Attorney, Agent, or Firm* — J.C. Patents

(57) ABSTRACT

An asymmetric stair structure includes multiple unit layers and has m regions (m≥2). In each of the m regions, a different part of unit layers having an interval of m unit layers each have a portion not covered by an upper adjacent unit layer, so that a stair having a step difference of m unit layers is formed. In arbitrary two of the m regions, the two different parts of unit layers include no repeated unit layers.

20 Claims, 5 Drawing Sheets

ASYMMETRIC STAIR STRUCTURE AND METHOD FOR FABRICATING THE SAME

BACKGROUND OF THE INVENTION

Field of Invention

This invention relates to a structure applicable to integrated circuits and fabrication thereof, and particularly relates to an asymmetric stair structure, and a method for fabricating the same.

Description of Related Art

In a structure of multiple layers of devices, such a three-dimensional (3D) device array such as a 3D memory array, the conductive lines for the respective levels of devices require electrical connection, so the conductive layers of the respective levels have to be exposed in a contact area for later electrical connection. As a result, a staircase contact pad structure is formed.

In a conventional method, such a stair structure is formed forming a series of mask layers gradually decreasing in size and performing one-layer etching steps and mask trimming steps alternately between the formations of the mask layers. FIG. 1 illustrates an example where 4 masks are used to form 4 patterned photoresist layers at different time points and, after each patterned photoresist layer is formed, 4 steps of etching exposed one unit layer 102 and 3 photoresist trimming steps are alternately performed. The portions being etched with the $1^{st}/2^{nd}/3^{rd}/4^{th}$ photoresist layer as a mask are portions 112/114/116/118, and totally 16 stairsteps are defined as a result.

However, such formed symmetric stair structure is quite wide, as each unit layer has two parts respectively exposed in the two halves of the symmetric stair structure and one of the two parts, namely a half of the exposed area thereof, is not used. As a result, waste of the chip area is caused.

SUMMARY OF THE INVENTION

In view of the foregoing, this invention provides an asymmetric stair structure, of which the area is less than that of the conventional stair structure by at least about 50% so that waste of the chip area can be significantly reduced.

This invention also provides a method for fabricating an asymmetric stair structure, which can produce an asymmetric stair structure of this invention.

The asymmetric stair structure of this invention comprises a plurality of unit layers, and m regions (m≥2). In each of the m regions, a different part of unit layers having an interval of m unit layers each have a portion not covered by an upper adjacent unit layer, so that a stair having a step difference of m unit layers is formed. In arbitrary two of the m regions, the two different parts of unit layers include no repeated unit layers.

In an embodiment, the total number of the unit layers is N (N≥16), and when the unit layers are numbered from 1-st to N-th from bottom to top, in an i-th region (i=1 to m), the numbers of the different part of unit layers are N−(i−1)−0× m, N−(i−1)−1×m, . . . and N−(i−1)−$k_i$×m, wherein $k_i$ is a largest integer not making N−(i−1)−$k_i$×m less than one.

The m stairs in the m regions may be arranged to form a peak shape or valley shape.

The two stairs in at least two of the m regions may have different or opposite rising directions, or may alternatively have the same rising direction.

The method for fabricating an asymmetric stair structure of this invention includes: forming a stack including a plurality of unit layers; a stair shaping process, including lithography, mask trimming, and etching steps each etching m unit layers, for making a stair shape having a step difference of m unit layers in each of m regions (m≥2); and m−1 local etching process(es) performed to the 2-nd to m-th region(s), wherein the local etching process performed to the i-th region (i=2 to m) etches i−1 unit layer(s). The m processes including the stair shaping process and the m−1 local etching process(es) are performed in arbitrary order.

It is possible that each unit layer includes a first material layer and a second material layer, and the first material layers and the second material layers of the unit layers are stacked alternately. In an embodiment, the unit layers are stacked on a substrate, the second material layer is on the first material layer in each unit layer, there is one more second material layer between the lowest unit layer and the substrate, and in at least one region of the 2-nd to m-th region(s) subjected to the m−1 local etching process(es), a portion of the substrate is exposed after the stair shaping process and a corresponding local etching process are performed.

Because the two different parts of unit layers in arbitrary two of the m regions include no repeated unit layers, the area of the asymmetric stair structure of this invention can be made less than that of the conventional symmetric stair structure by at least about 50%, and the larger the m value (m≥2) is, the more the chip area is saved.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are just exemplary but are not intended to limit the scope of this invention.

For example, the ratio of the total number N of the unit layers to the number m of the regions can be an integer, but this invention is not limited thereto. When the ratio N/m is an integer, the largest integer $k_i$ not making $N-(i-1)-k_i \times m$ less than 1 is N/m−1. The equality is derived as follows. $N-(i-1)-k_i \times m \geq 1$ is equivalent to $k_i \leq N/m - i/m$. When i=m, N/m−i/m is equal to N/m−1, which is also an integer, so that $k_i$ is equal to N/m−1. When i<m, i/m<1 so that N/m−i/m is larger than N/m−1 but smaller than N/m, and $k_i$ is still equal to N/m−1. When the ratio N/m is not an integer, $k_i$ is not a constant.

Figure 1:
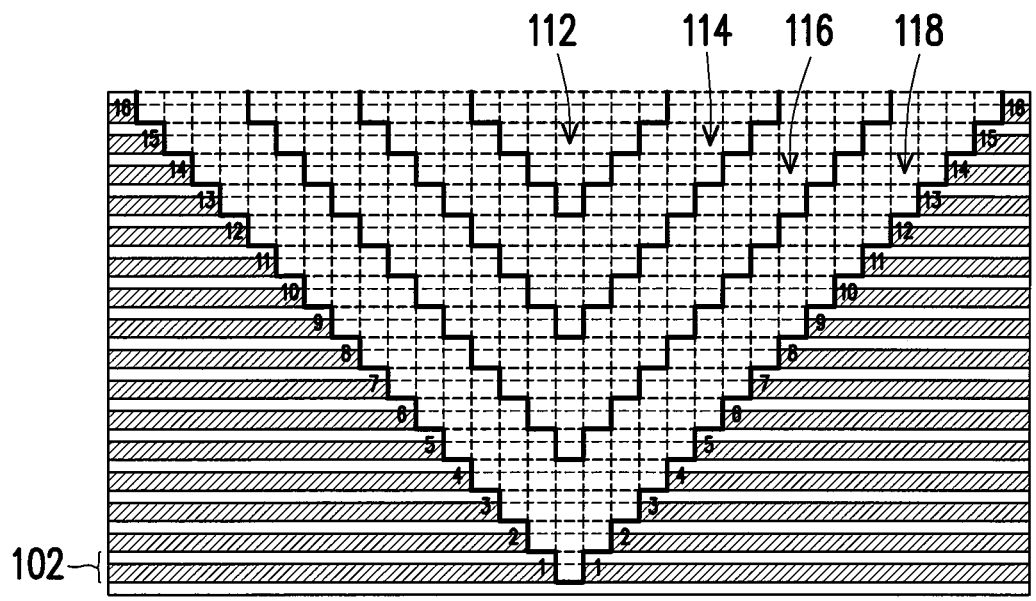
FIG. 1 illustrates a cross-section of a conventional symmetric stair structure, and indicates the portions being etched when different patterned photoresist layers are used as masks in the fabrication process thereof.
Figure 2:
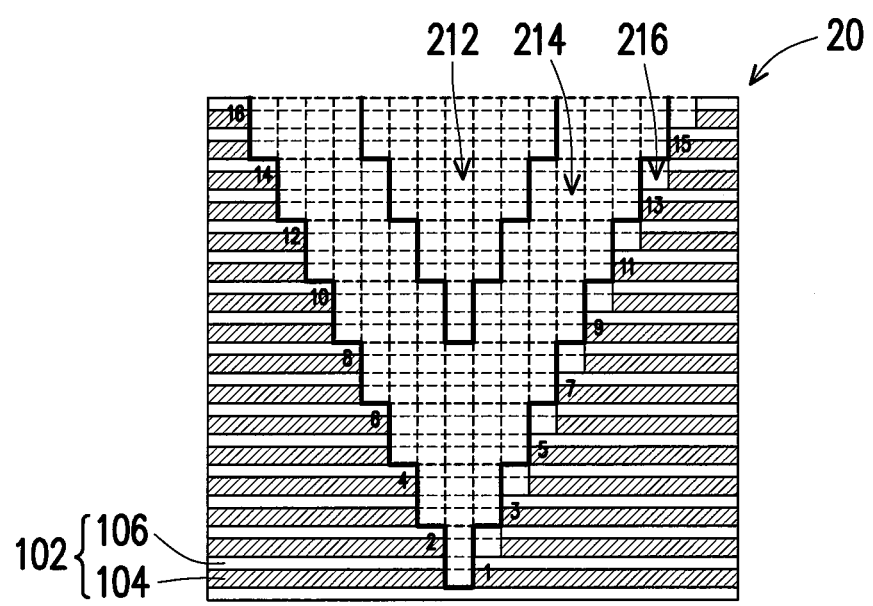
FIG. 2 illustrates a cross section of a valley-shaped asymmetric stair structure of m=2 according to an embodiment of this invention, and indicates the portions being etched when different patterned photoresist layers are used as masks in its exemplary fabrication process.

FIG. 2 illustrates a cross section of a valley-shaped asymmetric stair structure of m=2 according to an embodiment of this invention, and indicates the portions being etched when different patterned photoresist layers are used as masks in an exemplary fabrication process of the valley-shaped asymmetric stair structure of m=2.

Referring to FIG. 2, the asymmetric stair structure 20 has two regions (m=2), and includes 16 unit layers 102 (N=16). When the unit layers 102 are numbered from 1-st to N-th from bottom to top, the numbers of the unit layers exposed in the $1^{st}$ region (i=1) are 16 (=16−(1−1)−0×2), 14 (=16−(1−1)−1×2), 12, 10, 8, 6, 4, and 2 [=16−(1−1)−7×2, wherein the largest integer $k_i$ not making $N-(i-1)-k_i \times m$ less than 1 is 7 (=16/2−1=N/m−1)], namely even numbers, so that a stair having a step difference of two (=m) unit layers 102 is formed. the numbers of the unit layers exposed in the $1^{st}$ region (i=1) are 16 (=16−(1−1)−0×2), 14 (=16−(1−1)−1×2), 12, 10, 8, 6, 4, and 2 [=16−(1−1)−7×2, wherein the largest integer $k_i$ not making $N-(i-1)-k_i \times m$ less than 1 is 7 (=16/2−1=N/m−1)], namely even numbers, so that a stair having a step difference of two (=m) unit layers 102 is formed. There is apparently no repeated unit layers between the unit layers 102 of even numbers exposed in the first region and the unit layers 102 of odd numbers exposed in the second region, and the two stairs in the two regions are arranged to form a valley shape.

In addition, the numbering of first and second regions is just for satisfying the above rules, and does not have a particular meaning in the arrangement order or the like. It is possible that the region in which the unit layers of odd layers are exposed is designated the first region and the region in which the unit layers of even layers are exposed is designated a second region in other embodiments of m=2.

Each unit layer 102 may include a first material layer 104 and a second material layer 106 thereon, for example, wherein the first material layers 104 and the second material layers 106 of the unit layers 102 are stacked alternately. There may be one more second material layer 106 under the lowest unit layer 102, which may serve as an etching stopper for the first material layer 104 of the lowest unit layer 102. The materials of the first material layers 104 and the second material layers 106 may be, for example, a combination of silicon nitride (SiN) and silicon oxide, polysilicon and silicon oxide, tungsten and silicon oxide, cobalt silicide and silicon oxide, or nickel silicide and silicon oxide, etc.

The above asymmetric stair structure 20 can be fabricated with the aforementioned stair shaping process and one (=m−1) local etching process, possibly as illustrated in FIGS. 3A to 3F. in the stair shaping process, two photomasks (not shown) are used to form two patterned photoresist layers 212 and 214 at different time points, wherein 4 steps of etching two (=m) unit layers 102 and 3 mask trimming steps are performed after each patterned photoresist layer is formed to define a stair shape with 4 stairsteps in each of the two (=m) regions in a symmetric manner. With two such lithography-etching-trimming circles, a stair shape with totally 8 stairsteps each having a height of two (=m) unit layers 102 is defined in each of the two (=m) regions in a symmetric manner. In the only one (=m−1) local etching process, a third photomask (not shown) is used to form another patterned photoresist layer that masks one of the two regions, and one (=m−1) unit layer 102 exposed in the other region is removed. The three parts of the stack being removed respectively while the patterned photoresist layers 212, 214 and 216 are respectively used as masks are indicated in FIG. 2 by arrows and dash lines, distinguished apart by thick solid lines.

The above stair shaping process and local etching process are further explained below, referring to FIGS. 3A to 3E and FIGS. 3E to 3F, respectively.

Figure 3A:
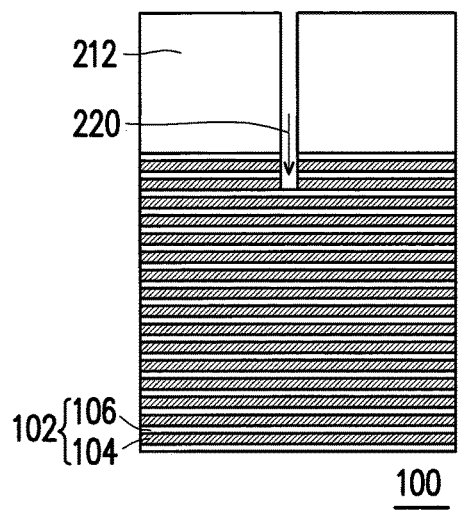
FIGS. 3A to 3F illustrate, in a cross-sectional view, a method for fabricating the valley-shaped asymmetric stair structure as shown in FIG. 2, according to an embodiment of this invention.

Referring to FIG. 3A, a stacked structure including 16 unit layers 102 is formed over a substrate 100. The substrate 100 may be a silicon substrate, and there may be one more second material layer 102 between the substrate 100 and the lowest unit layer 102. A patterned photoresist layer 212 is then formed exposing a portion of the stack, of which the width is the width of the valley bottom of the valley-shape asymmetric stair structure to be fabricated, possibly in the order of magnitude of angstroms to micrometers. An etching step 220 is then performed to remove two exposed unit layers 102 to define a stairstep having a step difference of two unit layers 102. It is preferred that there is a sufficient etching selectivity between the first material and the second material, so that a first material layer 104 can serve as an etching stopper for the adjacent upper second material layer 106 and a second material layer 106 can serve as an etching stopper for the adjacent upper first material layer 104. It is possible that the first material includes SiN and the second material includes silicon oxide.

Figure 3B:
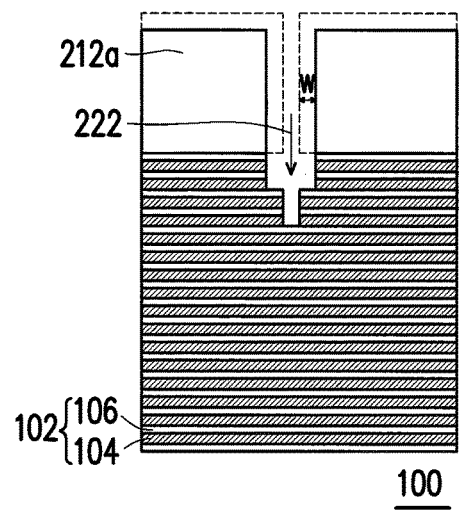

Referring to FIG. 3B, a mask trimming step is then performed to trim a width w as the width of one stairstep from the patterned photoresist layer 212, while the thickness of the patterned photoresist layer 212 is also reduced. The trimmed photoresist layer 212a is then used as a mask to perform another etching step 222 to remove two exposed unit layers 102, thereby defining one more stairstep also having a step difference of two unit layers 102 in a symmetric manner and simultaneously lowering the level of the surface of the previously defined stairstep by the thickness of two unit layers 102.

Figure 3C:
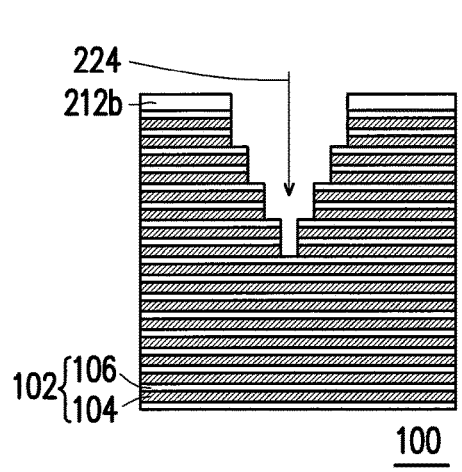

Then, two aforementioned mask trimming steps and two aforementioned etching steps each removing two exposed unit layer 102 are performed alternately to define two more stairsteps in a symmetric manner, so that there are totally 4 stairsteps including the previously defined two stairsteps and each having a step difference of two unit layers 102, as shown in FIG. 3C. The 4$^{th}$ etching step 224 is also shown in FIG. 3C. For the photoresist layer 212b having been subjected to the above mask trimming steps and etching steps is too thin to sustain one more trimming, it should be removed.

Figure 3D:
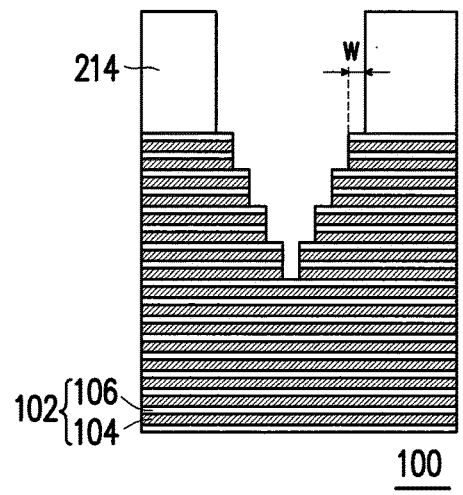
Figure 3E:
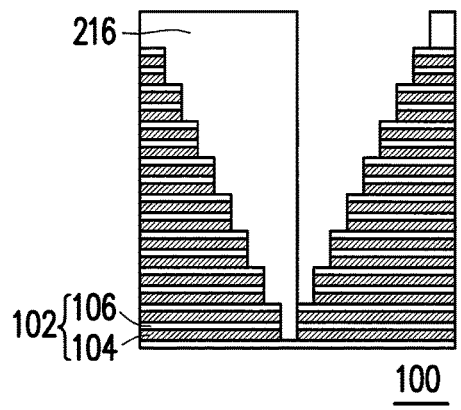

Referring to FIG. 3D, another patterned photoresist layer 214 is formed, of which the border retreats from the border of the preceding step by the width w, namely the width of one stairstep, and then four aforementioned etching steps each removing two exposed unit layer 102 and three aforementioned mask trimming steps are performed alternately to define 4 more stairsteps in a symmetric manner, so that there are totally 8 stairsteps including the previously defined four stairsteps and each having a step difference of two unit layers 102, as shown in FIG. 3E. The bottom second material layer 106 will be exposed after the last etching step.

Figure 3F:
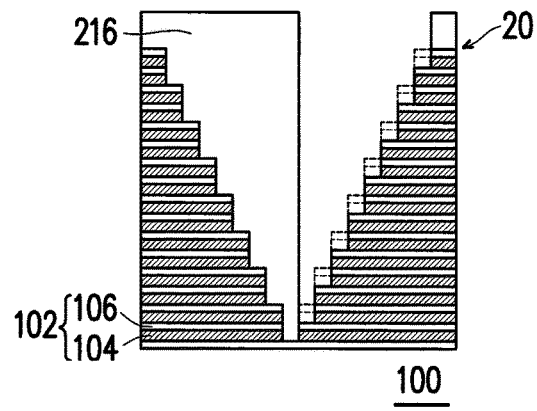

Thereafter, a local etching process is performed, where another patterned photoresist layer 216 is formed covering the left region, as shown in FIG. 3E, and then one unit layer 102 exposed in the right region is removed, as shown in FIG. 3F. In this embodiment, the border of the patterned photoresist layer 216 is aligned with that of the lowest stairstep in the right region, so that the bottom second material layer 106 is not etched.

Figure 4A:
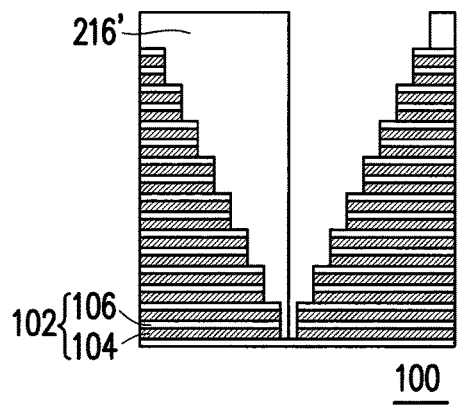
FIGS. 4A to 4B illustrate, in a cross-sectional view, the local etching process in a method for fabricating a valley-shaped asymmetric stair structure of m=2 according to another embodiment of this invention, wherein the stair shaping process of the another embodiment can be the same as that shown in FIGS. 3A to 3D.
Figure 4B:
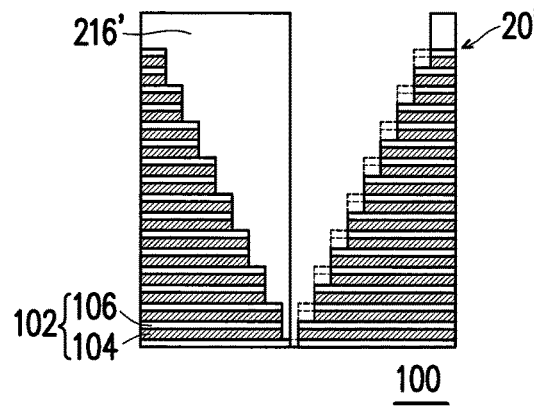

However, it is not easy to exactly align the border of the patterned photoresist layer 216 with that of the lowest stairstep in the right region, so the border of the former is usually predetermined to between the border of the lowest stairstep in the left region and the border of the lowest stairstep in the right region, as shown by the patterned photoresist layer 216' in FIG. 4A, so that the width of the lowest stairstep in the left region or the lowest stairstep in the right region in the product would not be reduced. In such embodiment, a portion of the bottom second material layer 106 in the right region will be removed due to the local etching process to expose a portion of the underneath substrate 100 in the right region, as shown in FIG. 4B, so as to form an asymmetric stair structure 20'.

In addition, in an embodiment where the first material layers 104 and the second material layers 106 include SiN and silicon oxide, respectively, after the above asymmetric stair structure is formed, the SiN may be replaced by a conductive material such as poly-Si, tungsten, cobalt silicide, or nickel silicide, etc. using a known method to obtain an asymmetric stair structure based on alternately stacked conductive material layers and silicon oxide layers.

Figure 5:
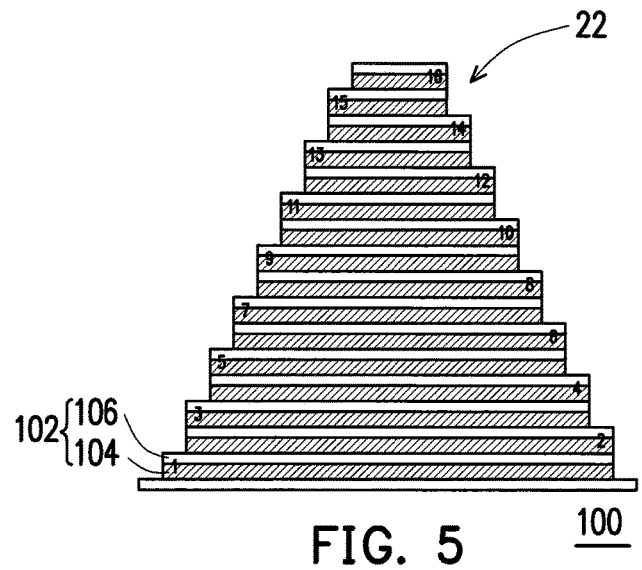
FIG. 5 illustrates a cross-section of a peak-shaped asymmetric stair structure of m=2 according to an embodiment of this invention.

Although the asymmetric stair structure 20 or 20' in the above embodiments has a valley shape, this invention is not limited thereto, and the asymmetric stair structure thereof may have a peak shape in other embodiments, as shown in FIG. 5. The width of the peak top part of such asymmetric stair structure 22, namely the width of the upmost unit layer 102 of the same, is possibly in the order of magnitude of angstroms to micrometers. Fabrication of the asymmetric stair structure 22 is different from that of the asymmetric stair structure 20 or 20' mainly in that in the stair shaping process thereof, the border of the patterned photoresist layers is gradually retreated from both sides of the asymmetric stair structure formation area toward the center of the asymmetric stair structure formation area.

In addition, though in the above embodiment the stair shaping process is performed before the local etching process, this invention is not limited thereto. The stair shaping process may alternatively be performed after the local etching process in other embodiments.

Figure 6:
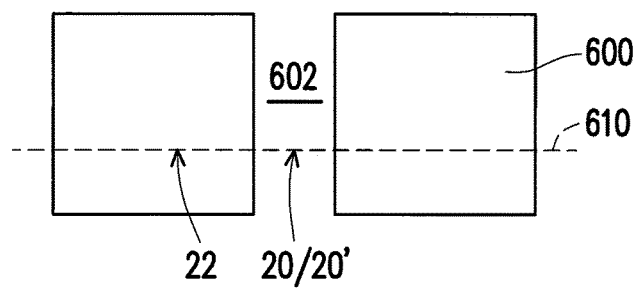
FIG. 6 illustrates respective locations of a valley-shaped asymmetric stair structure and a peak-shaped asymmetric stair structure according to an embodiment of this invention.

Moreover, referring to FIG. 6, it is possible that the above peak-shaped asymmetric stair structure 22 is formed in the memory area 600 and the above valley-shaped asymmetric stair structure 20 or 20' formed in the periphery area 602 in an embodiment, where the cross section line 610 corresponds to the cross-sectional views of FIG. 3F/4B and FIG. 5.

Figure 7:
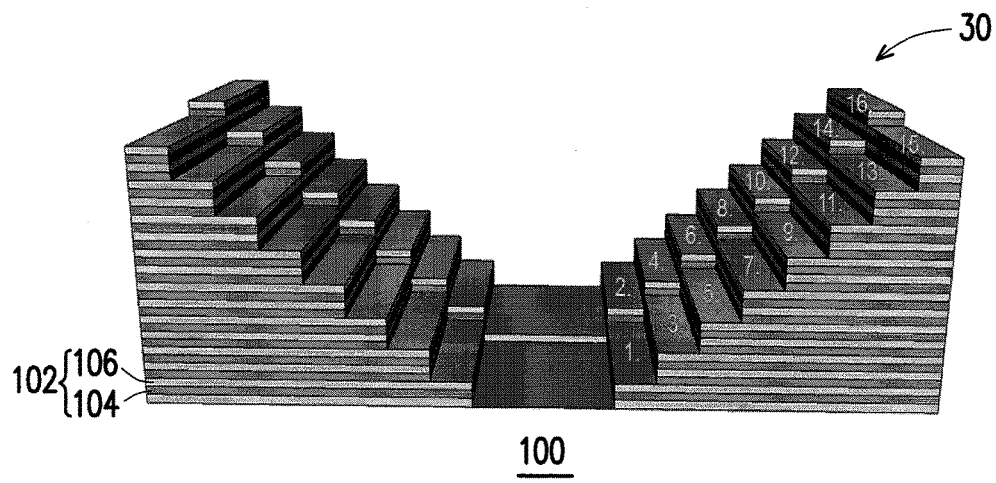
FIG. 7 illustrates a valley-shaped asymmetric stair structure of m=2 in which the stair rising directions in the two regions thereof are the same, according to an embodiment of this invention.

On the other hand, though in the above embodiments the valley-shaped asymmetric stair structure 20 or 20' and the peak-shaped asymmetric stair structure 22 both have a design that the rising directions of the two stairs in the two regions are opposite to each other, this invention is not limited thereto. The rising directions of the two stairs in the two regions may alternatively be the same, as shown by the asymmetric stair structure 30 illustrated in FIG. 7. The two regions of the asymmetric stair structure 30 is asymmetric with respect to a vertical plane parallel to the rising direction of the stair, but is symmetric with respect to another vertical plane crossing the center of the valley bottom and perpendicular to the above vertical plane.

In addition, fabrication of the valley-shaped asymmetric stair structure 30 is different from that of the valley-shaped asymmetric stair structure 20 or 20' mainly in that in the local etching process thereof, the border plane of the patterned photoresist layer is parallel to the rising direction of the stair. Another feature of such formed asymmetric stair structure 30 is that a portion of the bottom second material layer 106 will certainly be removed due to the local etching process to expose a portion of the underneath substrate 100.

Although in the above embodiments the asymmetric stair structures all have two regions (m=2), this invention is not limited thereto. The number m of the regions thereof may be another integer that is greater than 2, but is usually a number making the ratio of the total step number N thereto be an integer. When N=16, the integer greater than 2 may be 4, and such asymmetric stair structure may be fabricated as in the following embodiment.

Figure 8:
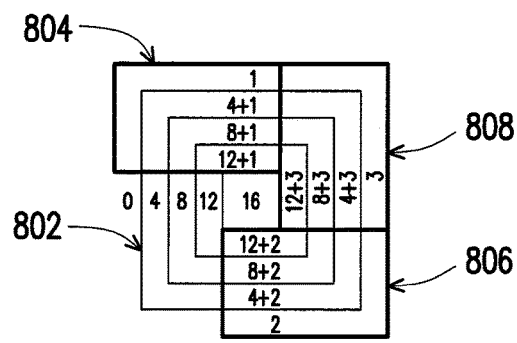
FIG. 8 shows the number of removed unit layer(s) in each stairstep region in the m regions in the fabrication of a valley-shaped asymmetric stair structure of m=4 according to an embodiment of this invention.

Referring to FIG. 8, a valley-shaped asymmetric stair structure with N=16 and m=4 is fabricated in this embodiment, wherein each etching step in the stair shaping process etch 4 (=m) unit layers 102, so just four etching steps are sufficient to etch down to the lowest unit layer. Hence, the number of the mask trimming steps is still three (=4−1), so that only one patterned photoresist layer is required to form in the stair shaping process. The region 802 is etched as the patterned photoresist layer for the stair shaping process is used as a mask, wherein the number of removed layers in each stairstep region is shown by small numerals. The number of the local etching processes to be performed is three (=m−1). The three local etching processes are performed to the regions 804, 806 and 808, respectively, each of which overlaps with a different part of the region 802, to remove one unit layer, two unit layers and three unit layers, respectively, wherein the number of removed layers in each stairstep region is also shown by small numerals. For arbitrary one of the stairstep regions to be subjected to the local etching process, the total number of removed unit layer(s) is the sum of the number of removed unit layer(s) in the stair shaping process and the number of removed unit layer(s) in the local etching process to which the stairstep region is subjected. For each stairstep region, the number obtained by subtracting the total number of removed unit layer(s) from the total number N of the unit layers is the number of the unit layer exposed in the stairstep region, while the numbering starts from the lowest unit layer.

It is also clear from the numbers of removed unit layer(s) as shown in FIG. 8 that the above four processes including the stair shaping process and the three (=m−1) local etching processes can be performed in arbitrary order without changing the total number of removed unit layer(s) in each stairstep region.

Figure 9:
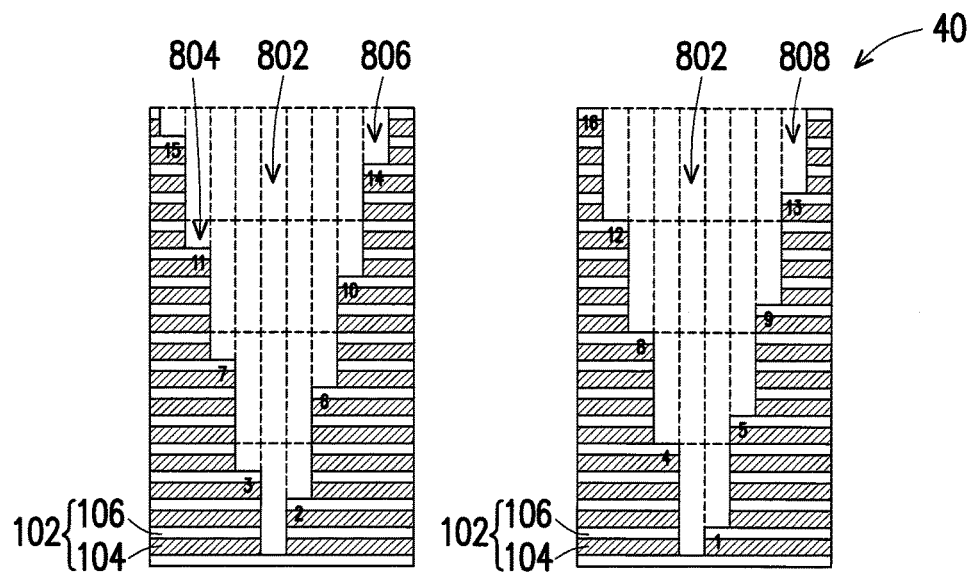
FIG. 9 illustrates different cross sections of a valley-shaped asymmetric stair structure of m=4 according to an embodiment of this invention, and indicates the portions being etched when different patterned photoresist layers are used as masks in an exemplary fabrication process of the valley-shaped asymmetric stair structure of m=4.

FIG. 9 illustrates different cross sections of such formed asymmetric stair structure 40, wherein the portions of the stack being removed in the etching to the region 802, 804, 806 or 808 are indicated, and the number of the unit layer 102 exposed in each stairstep region while the numbering starts from the lowest unit layer 102 is shown. When the above rule that the numbers of the unit layers exposed in the i-th region (i=1 to m) are $N-(i-1)-0\times m$, $N-(i-1)-1\times m$, ... and $N-(i-1)-k_i\times m$ is applied, the numbers of the unit layers 102 exposed in the $1^{st}$ region (i=1) are 16 [=16-(1-1)-0×4], 12 [=16-(1-1)-1×4], 8 and 4 [=16-(1-1)-3×4], those in the $2^{nd}$ region (i=2) are 15 [=16-(2-1)-0×4], 11 [=16-(2-1)-1×4], 7 and 3 [=16-(2-1)-3×4], those in the $3^{rd}$ region (i=3) are 14 [=16-(3-1)-0×4], 10 [=16-(3-1)-1×4], 6 and 2 [=16-(3-1)-3×4], and those in the $4^{th}$ region (i=4) are 13 [=16-(4-1)-0×4], 9 [=16-(4-1)-1×4], 5 and 1 [=16-(4-1)-3×4], wherein the largest integer $k_i$ not making $N-(i-1)-k_i\times m$ less than 1 is always 3 (=16/4-1=N/m-1) regardless of the value of i.

Figure 10:
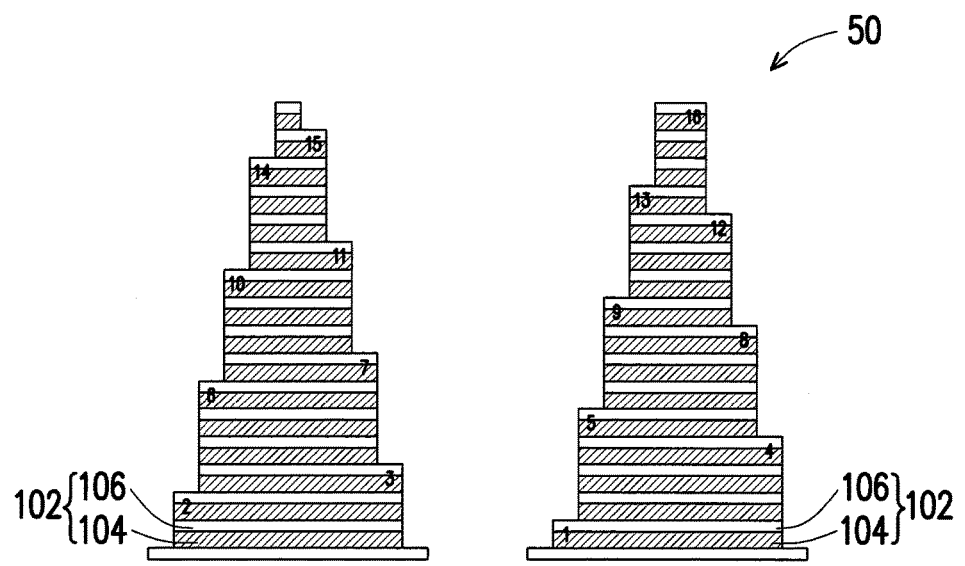
FIG. 10 illustrates different cross sections of a peak-shaped asymmetric stair structure of m=4 according to an embodiment of this invention.

Though the asymmetric stair structure of m=4 fabricated in the above embodiment has a valley shape, the asymmetric stair structure of m=4 of this invention may alternatively have a peak shape, as shown by the peak-shaped m=4 asymmetric stair structure 50 of which different cross-sectional views are illustrated in FIG. 10. Fabrication of the asymmetric stair structure 50 is different from that of the asymmetric stair structure 40 mainly in that in its stair shaping process, the border of the patterned photoresist layer is gradually retreated from the circumference of the asymmetric stair structure formation area toward the center of the same.

In addition, although in the above embodiments the number m of the regions of the asymmetric stair structures is 2 or 4, m may be another integer larger than 1 in this invention, as long as m-1 regions each overlapping with the respective stairstep regions to be defined by the stair shaping process are predetermined for the m-1 local etching processes. Moreover, though in each of the above embodiments the ratio of the total number N of the unit layers to the number m of the regions is an integer, the ratio N/m may alternatively not be an integer in this invention. An example for both of the above two changes is given below. When N=17 and m=3, it is possible that the numbers of the unit layers exposed in the $1^{st}$ region that has been subjected to the stair shaping process only are 17, 14, 11, 8, 5 and 2 ($k_i$=5 when i=1), the numbers of the unit layers exposed in the $2^{nd}$ region that has been subjected to the local etching process removing one exposed unit layer are 16, 13, 10, 7, 4 and 1 ($k_i$=5 when i=2), and the numbers of the unit layers exposed in the $3^{rd}$ region that has been subjected to the local etching process removing two exposed unit layers are 15, 12, 9, 6 and 3 ($k_i$=4 when i=3). As in the case of m=2, the numbering of $1^{st}$, $2^{nd}$ and $3^{rd}$ regions is just for satisfying the above rules [the numbers of the exposed unit layers are $N-(i-1)-0\times m$, $N-(i-1)-1\times m$, ... and $N-(i-1)-k_i\times m$], and does not have a particular meaning in the arrangement order or the like.

Because the two different parts of unit layers in arbitrary two of the m regions include no repeated unit layers, the area of the asymmetric stair structure of this invention can be made less than that of the conventional symmetric stair structure by at least about 50%, and the larger the m value (m≥2) is, the more the chip area is saved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An asymmetric stair structure, comprising:
    a plurality of stacked unit layers, and m regions (m≥2), wherein
    in each of the m regions, a different part of unit layers having an interval of m unit layers each have a portion not covered by an upper adjacent unit layer, so that a stair having a step difference of m unit layers is formed, wherein the m value of the m unit layers is equal to the m value of the m regions, and each of the interval and the step difference is a height difference in terms of a number of unit layers between arbitrary two adjacent steps in the stair, and
    in arbitrary two of the m regions, the two different parts of unit layers do not repeat in number of unit layer when all of the unit layers are numbered according to an order of stacking of the unit layers.

2. The asymmetric stair structure of claim 1, wherein
    a total number of the unit layers is N (N≥16),
    when the unit layers are numbered from 1-st to N-th from bottom to top, in an i-th region (i=1 to m), numbers of the different part of unit layers are $N-(i-1)-0\times m$, $N-(i-1)-1\times m$, ... and $N-(i-1)-k_i\times m$, wherein $k_i$ is a largest integer not making $N-(i-1)-k_i\times m$ less than one.

3. The asymmetric stair structure of claim 1, wherein the m stairs in the m regions are arranged to form a peak shape.

4. The asymmetric stair structure of claim 1, wherein the m stairs in the m regions are arranged to form a valley shape.

5. The asymmetric stair structure of claim 1, wherein m is 2, a portion of each of the unit layers of odd numbers is not covered by an upper adjacent unit layer in one of the 2 regions, and a portion of each of the unit layers of even numbers is not covered by an upper adjacent unit layer in the other of the 2 regions.

6. The asymmetric stair structure of claim 2, wherein m is 4, a ratio of N to m is an integer, and $k_i$ (i=1 to 4) is N/4-1.

7. The asymmetric stair structure of claim 1, wherein the two stairs in at least two of the m regions have different or opposite rising directions.

8. The asymmetric stair structure of claim 1, wherein the two stairs in at least two of the m regions have the same rising direction.

9. The asymmetric stair structure of claim 1, wherein each unit layer comprises a first material layer and a second material layer, and the first material layers and the second material layers of the unit layers are stacked alternately.

10. The asymmetric stair structure of claim 9, wherein
    the unit layers are stacked on a substrate,
    in each unit layer, the second material layer is on the first material layer, and
    there is one more second material layer between a lowest unit layer and the substrate, the one more second material layer covering the substrate, or exposing a portion of the substrate in at least one of the m regions.

11. The asymmetric stair structure of claim 9, wherein the first material layer comprises silicon nitride, polysilicon, tungsten, cobalt silicide, or nickel silicide, and the second material layer comprises silicon oxide.

12. The asymmetric stair structure of claim 1, wherein a ratio of a total number N of the unit layers to m is an integer.

13. A method for fabricating an asymmetric stair structure, comprising:
    forming a stack comprising a plurality of unit layers;

a stair shaping process, including lithography, mask layer trimming, and etching steps each etching m unit layers, for making a stair shape having a step difference of m unit layers in each of m regions (m≥2), wherein the m value of the m unit layers is equal to the m value of the m regions, and the step difference is a height difference in terms of a number of unit layers between arbitrary two adjacent steps in the stair shape in each of the m regions; and m−1 local etching process(es), performed to 2-nd to m-th region(s), wherein the local etching process performed to the i-th region (i=2 to m) etches i−1 unit layer(s) and is not performed to the other of the m regions, wherein the m processes including the stair shaping process and the m−1 local etching process(es) are performed in arbitrary order.

14. The method of claim 13, wherein the stair shaping process includes at least one lithography step, at least one mask trimming step, and at least two etching steps, and after each lithography step, at least two etching steps and at least one mask trimming step are alternately performed.

15. The method of claim 13, wherein each unit layer comprises a first material layer and a second material layer, and the first material layers and the second material layers of the unit layers are stacked alternately.

16. The method of claim 15, wherein the unit layers are stacked on a substrate, in each unit layer, the second material layer is on the first material layer, there is one more second material layer between a lowest unit layer and the substrate, and in at least one region of the 2-nd to m-th region(s) subjected to the m−1 local etching process(es), a portion of the substrate is exposed after the stair shaping process and a corresponding local etching process are performed.

17. The method of claim 15, wherein the first material layer comprises silicon nitride and the second material layer comprises silicon oxide.

18. The method of claim 13, wherein the m stair shapes in the m regions are arranged to form a peak shape.

19. The method of claim 13, wherein the m stair shapes in the m regions are arranged to form a valley shape.

20. The method of claim 13, wherein a ratio of a total number N of the unit layers to m is an integer.

* * * * *